(12) United States Patent
Jarek

(10) Patent No.: US 6,645,689 B2
(45) Date of Patent: Nov. 11, 2003

(54) SOLVENT RESISTANT POLYMERS WITH IMPROVED BAKEABILITY FEATURES

(75) Inventor: Mathias Jarek, Northeim (DE)

(73) Assignee: Kodak Polychrome Graphics LLC, Norwalk, CT (US)

( * ) Notice: Subject to any disclaimer, the term of this patent is extended or adjusted under 35 U.S.C. 154(b) by 29 days.

(21) Appl. No.: 10/096,651

(22) Filed: Mar. 13, 2002

(65) Prior Publication Data

US 2003/0194633 A1 Oct. 16, 2003

(51) Int. Cl.$^7$ ............................................. G03F 7/023
(52) U.S. Cl. ...................... 430/168; 430/165; 430/190; 430/191; 430/192; 430/193; 430/270.1
(58) Field of Search ................................. 430/165, 168, 430/190, 191, 192, 193, 270.1; 526/258, 317.1

(56) References Cited

U.S. PATENT DOCUMENTS 5,609,983 A    3/1997  Kawamura et al. ......... 430/193
5,731,127 A  * 3/1998  Ishizuka et al. ......... 430/270.1

(List continued on next page.)

FOREIGN PATENT DOCUMENTS

| EP | 0737896 | 10/1996 |
|----|---------|---------|
| JP | 1291245 | 11/1989 |
| JP | 3289655 | 12/1991 |

OTHER PUBLICATIONS

U.S. application for "Copolymer For Improving the Chemical and Developer Resistance of Positive Working Printing Plates", S/N 09/630,917 by Mathias Jarek, pending.

(List continued on next page.)

*Primary Examiner*—John S. Chu
(74) *Attorney, Agent, or Firm*—Faegre & Benson LLP

(57) ABSTRACT

A radiation-sensitive composition for use in printing plates is described. The composition comprises: (a) at least one novolak; (b) at least one naphthoquinone diazide derivative; and (c) a copolymer comprising units A, B, and a unit C comprising a cyclic terminal urea group, wherein unit A is present in an amount of about 5 to about 50 mol % and has the formula

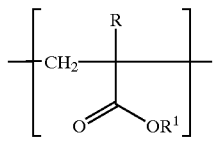

A wherein $R^1$ is selected such that the homopolymer of A is alkali-soluble, unit B is present in an amount of about 20 to about 70 mol % and has the following formula

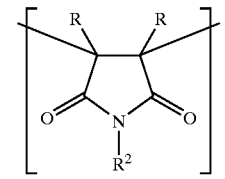

B wherein $R^2$ is selected such that the homopolymer of B has a glass transition temperature greater than 100° C., preferably a glass transition temperature in the range from about 100 to about 380° C., and the unit C comprising a cyclic terminal urea group is present in an amount of about 10 to about 50 mol % and has the formula

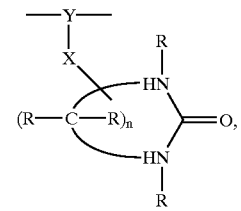

C wherein X is a spacer group which is preferably selected from the group consisting of (a) a —$(CR_2)_m$— chain, (b) a —$[CH_2$—$CH_2$—$O]_m$— chain; and (c) a —$[Si(R_2)$—$O]_m$— unit, wherein m is an integer greater than or equal to 1, more preferably between 2 and 12, the spacer group is connected to one of the carbon ring atoms of the cyclic urea unit or to one of the nitrogen atoms of the cyclic urea unit, and n is an integer greater than or equal to 1, more preferably between 1 and 5; and Y is a group selected from the group consisting of:

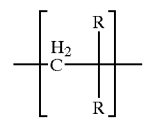 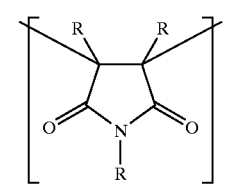

and

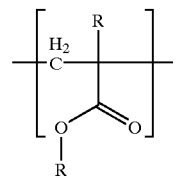

wherein each R in units A, B, and C, the —$(CR_2)_m$— chain, the —$[Si(R_2)$—$O]_m$— unit, and group Y is independently selected from hydrogen, aryl, $(C_1$–$C_{12})$ alkyl, and halogen.

27 Claims, No Drawings

U.S. PATENT DOCUMENTS 5,939,242 A * 8/1999 Tang et al. ............... 430/329
6,190,825 B1 * 2/2001 Denzinger et al. ......... 430/192
6,475,692 B1 * 11/2002 Jarek et al. ............... 430/165

OTHER PUBLICATIONS

U.S. patent application for "Radiation–Sensitive Compositions for Printing Plates for Improving their Chemical and Developer Resistance and Printing Plates Comprising Such Compositions", S/N 09/630,920 By Mathias Jarek and Gerhard Hauck, pending.

* cited by examiner

SOLVENT RESISTANT POLYMERS WITH IMPROVED BAKEABILITY FEATURES

BACKGROUND OF THE INVENTION

1. Field of the Invention

The present invention relates to solvent resistant polymers for use in printing plates, and printing plates employing such polymers. In particular, the present invention relates to a polymer having a monomeric unit comprising a cyclic terminal urea group, which renders the polymer bakeable, and a printing plate employing such a polymer.

2. Background Information

Recently, the resistance of offset printing plates to solvents and common printing room chemicals such as plate cleaning agents or rubber blanket washing agents as well as to alcohol substitutes in the fountain water has had to meet ever increasing demands. Particularly in printing processes using UV-curing inks, where rinsing agents with a high content of esters, ethers or ketones are used, the chemical resistance of conventional positive working printing plates is no longer sufficient without special stabilizing processes. To improve the chemical resistance of positive working offset printing plates, three approaches have essentially been discussed:

1) In the most basic case, positive working offset printing plates comprise two components, namely a naphthoquinone diazide (NQD) derivative and a novolak. One possibility is to chemically alter the NQD such that it has an increased chemical and solvent resistance (e.g. U.S. Pat. No. 5,609,983). The disadvantage of this method is that the resistance of a printing plate produced therefrom cannot be increased indefinitely by increasing the NQD content since the NQD content must lie in a certain range to be viable from a practical point of view.

2) Another approach is to thermally stabilize a conventional positive working printing plate (based on novolak and NQD). This can be carried out either by "baking" or by means of the Pulsar™ process. During baking, a completely developed printing form is heated to about 230° C. for a few minutes causing the mostly phenolic binders to cross-link. This results in an extremely high chemical and mechanical resistance. In the Pulsar™ process, the developed printing plate is subjected to a short-time "shock heating" to about 175° C. This results in a slight cross-linking (and thus an increase in the chemical resistance) of the image areas. For the user, the two thermal stabilizing processes entail the important disadvantage that they require somewhat complicated apparatuses and are therefore quite costly.

3) A third option is the change of the binder content of a radiation-sensitive composition. For example, additives can be added to the formulation. However, in the case of commercially available additives, the amount to be added is often limited since these substances are not adapted to the composition and therefore often affect the properties of the printing plate when added at too high a concentration.

Another frequently used method is the use of higher molecular novolaks; however, this leads to a deterioration of the photosensitivity of the composition which leads to a considerable loss of time for the user, particularly in the case of high numbers of prints or when so-called "Step & Repeat" exposure machines are used.

Furthermore, the properties of the binders in the photosensitive composition can be improved by way of chemical modification. Such special binders with a high degree of chemical resistance are either not commercially available or very expensive. Accordingly, it is often necessary for manufacturers to develop their own binders. To avoid high costs in the developing process, efforts must be made to keep the synthetic requirements for preparing such tailor-made high-performance binders as simple as possible.

For example, U.S. patent application Ser. No. 09/630,920 describes radiation-sensitive compositions which significantly increase the chemical resistance of printed circuit boards for integrated circuits, photomasks and in particular printing forms. However, the compositions of U.S. patent application Ser. No. 09/630,920 are not bakeable, which means they do not harden upon heating. The chemical resistance to solvents of the urea-containing copolymers is even higher than for the polymers described in U.S. patent application Ser. No. 09/630,920.

JP 90/91752 describes a solvent resistant polymer comprising epoxide functionalities. The polymer is not described as being suitable for thermal applications.

JP 88/121546 describes polymers suitable for UV-ink plates. The polymers contain amide and carboxylic acid groups, but no urea groups.

EP 0 737 896 discloses solvent resistant polymers. The polymers do not contain terminal urea groups and are not described as being bakeable or suitable for thermal applications.

Therefore, despite intensive research in the field of chemically resistant binders for offset printing plates, there is a need in the art for a radiation-sensitive composition with high solvent resistance for use in printing plates. It is an object of this invention to provide such a radiation-sensitive composition. It is another object of this invention to provide a printing plate having such a radiation-sensitive composition.

SUMMARY OF THE INVENTION

Accordingly, it is an object of this invention to provide a copolymer for use in coating compositions for printing plate precursors, the copolymer comprising the units A, B, and a unit C comprising a cyclic terminal urea group, wherein unit A is present in an amount of about 5 to about 50 mol % and has the following formula

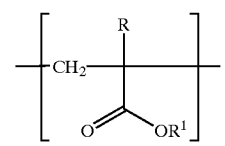

A wherein $R^1$ is selected such that the homopolymer of A is alkali-soluble, unit B is present in an amount of about 20 to about 70 mol % and has the following formula

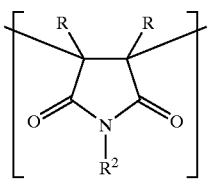

wherein $R^2$ is selected such that the homopolymer of B has a glass transition temperature greater than 100° C., preferably a glass transition temperature in the range from about 100 to about 380° C., and the unit C comprising a cyclic terminal urea group is present in an amount of about 10 to about 50 mol % and has the formula

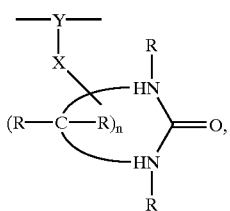

wherein X is a spacer group which is preferably selected from the group consisting of (a) a —$(CR_2)_m$— chain, (b) a —$[CH_2—CH_2—O]_m$— chain; and (c) a —$[Si(R_2)—O]_m$— unit, m is an integer greater than or equal to 1, more preferably between 2 and 12, the spacer group is connected to one of the carbon ring atoms of the cyclic urea unit or to one of the nitrogen atoms of the cyclic urea unit, and n is an integer greater than or equal to 1, more preferably between 1 and 5; and Y is a group selected from the group consisting of:

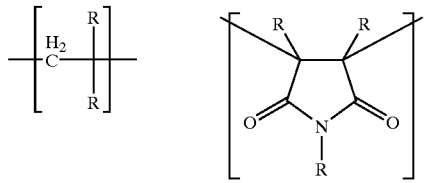

and

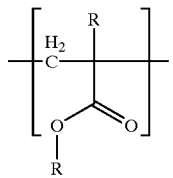

wherein each R in units A, B, and C, the —$(CR_2)_m$— chain, the —$[Si(R_2)—O]_m$— unit, and group Y is independently selected from hydrogen, aryl, ($C_1$–$C_{12}$) alkyl, and halogen.

It is another object of this invention to provide a radiation-sensitive composition comprising:
(a) at least one novolak;
(b) at least one naphthoquinone diazide derivative; and
(c) a copolymer comprising the units A, B, and a unit C comprising a cyclic terminal urea group, wherein units A, B, and C are as defined above.

It is another object of the present invention to provide a printing plate comprising a substrate and a radiation-sensitive layer comprising a composition as defined above.

It is another object of the present invention to provide a method for producing a printing plate comprising: (a) providing a substrate; (b) preparing a solution of a radiation-sensitive composition as defined above in an organic solvent; (c) applying the solution prepared in step (b) to the substrate; and (d) drying the solution.

In one embodiment of the invention, the copolymer of the invention further comprises unit D, wherein unit D is present in an amount of about 10 to about 50 mol % and has the following formula

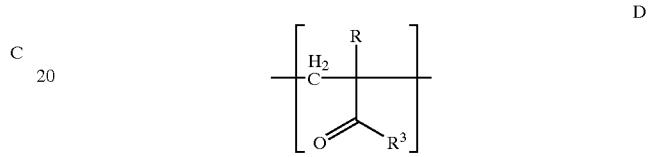

wherein $R^3$ is selected such that the homopolymer of D is miscible with water in any ratio, with the proviso that unit D is different from unit A, and R is independently selected from hydrogen, aryl, ($C_1$–$C_{12}$) alkyl, and halogen.

In another embodiment of the invention, the copolymer of the invention does not comprise unit D, wherein unit D is defined above.

The copolymers of the present invention can be used as "stand-alone" binders in a plate or can be used as an additive. When used as an additive, the copolymers of the present invention strongly increase the chemical resistance of the plate. Accordingly, this invention can be useful in any application requiring a radiation sensitive formulation with high solvent resistance, including positive working plates, thermal plates, and even UV-ink resistant plates thanks to the extremely high chemical resistance of the polymers. Furthermore, the copolymers of this invention have the advantage of being bakeable. The copolymers of this invention can therefore also be useful as substitutes for radiation sensitive but non-bakeable polymers. Higher run lengths are possible with the bakeable copolymers of this invention.

DETAILED DESCRIPTION OF THE INVENTION

The copolymer employed in the radiation-sensitive composition of this invention comprises a backbone comprising units A, B, and a unit C comprising a cyclic terminal urea group, where A, B and C are defined above. Without wishing to be bound by any one theory, each of units A, B, and unit C comprising a cyclic terminal urea group are believed to have a specific function in the copolymer.

Structural unit A is believed to be responsible for the alkali-solubility of the copolymer according to the present invention. As a prerequisite, the homopolymer of monomer A must be alkali-soluble. Monomer A may also be water-soluble.

Structural unit B is believed to be mainly responsible for a high glass temperature of the copolymer and thus also prevents a rapid penetration of organic solvents. As a prerequisite, the homopolymer of B must have a high glass transition temperature, preferably above 100° C., more preferably a glass transition temperature in the range from about 100 to about 380° C.

Structural unit C comprising a cyclic terminal urea group are believed to provide increased chemical resistance, including resistance to UV-ink, and bakeability of the polymer. Herein the term bakeability is intended to mean the capability of forming a chemically crosslinked layer upon heating at a temperature above 200° C. for 2 minutes.

In one embodiment of the invention, the copolymer further comprises unit D, where unit D is defined above. In this embodiment of the invention, unit D is believed to have a specific function in the copolymer, which is to ensure a sufficient hydrophilicity of the copolymer so that the copolymer can be developed quickly and completely and that there is no undesired skin formation during the developing process. As a prerequisite, the homopolymer of structural unit D must be water-soluble, preferably alkali-soluble.

The following applies throughout the application:

Unless otherwise defined, the term "alkyl" in this application is intended to signify straight-chain or branched alkyl groups with 1 to 12 carbon atoms, preferably 1 to 4 carbon atoms;

the term "cycloalkyl" signifies cycloalkyl groups with 3 to 8 ring-carbon atoms, preferably 5 or 6 ring-carbon atoms;

the term "aryl" signifies phenyl, naphthyl, anthryl or an N-substituted carbazole group; and the term "halogen" signifies fluorine, chlorine, bromine or iodine.

Unless stated otherwise, the terms "alkyl" and "cycloalkyl" comprise unsubstituted alkyl groups and cycloalkyl groups, respectively, as well as alkyl groups and cycloalkyl groups having at least one substituent selected from halogen atoms and the —$NO_2$ substituent.

Furthermore, unless stated otherwise, the term "aryl" in the present application is intended to signify unsubstituted aryl groups as well as aryl groups having at least one substituent selected from halogen atoms, alkyl groups and —$NO_2$.

The term "alkoxy group" comprises alkoxy groups with 1 to 12 carbon atoms; the alkyl unit of the alkoxy groups can be branched, straight-chain or cyclic and may optionally contain one or several substituents selected from —OH, a halogen atom, an alkyl group and an aryl group.

The substituent R in all structures described herein is independently selected from hydrogen, aryl, ($C_1$-$C_{12}$) alkyl, and halogen.

Preferably, $R^1$ is hydrogen, aryl having at least one hydroxy group, and optionally at least one substituent selected from halogen, ($C_1$-$C_{12}$) alkyl and —$NO_2$, or ($C_1$-$C_{12}$) alkyl having at least one carboxy group. It is especially preferred when $R^1$ is hydrogen, hydroxyphenyl or carboxy-($C_1$-$C_4$) alkyl.

$R^2$ is preferably hydrogen; aryl optionally having at least one substituents selected from halogen, alkyl, —$NO_2$, —OH, and cycloalkyl. It is especially preferred when $R^2$ is hydrogen, phenyl, cyclohexyl or hydroxyphenyl.

Preferably, $R^3$ is hydrogen, ($C_1$-$C_{12}$) alkyl having at least one hydroxy group and optionally also one or several substituents selected from halogen and —$NO_2$, ($C_3$-$C_8$) cycloalkyl having at least one hydroxy group and optionally also one or several substituents selected from halogen and —$NO_2$, aryl having at least one hydroxy group and optionally one or several substituents selected from halogen, ($C_1$-$C_{12}$) alkyl and —$NO_2$, —NH($CH_2$)$_n$O-alkyl wherein n is an integer from 1 to 20, —$NHR^4$ (wherein $R^4$ is hydrogen, ($C_1$-$C_{12}$) alkyl or aryl), or ($C_1$-$C_{12}$) alkoxy. It is especially preferred when $R^3$ is —$NH_2$ or —NH—$CH_2$—O—$CH_3$.

The content of monomer unit A in the copolymer of the present invention is at least 5 and at most 50 mol % based on the copolymer. Preferably, the content of A is 7 to 40 mol %, most preferably 10 to 30 mol %. The content of unit B is 20 to 70 mol % based on the copolymer, preferably 35 to 60 mol %. The content of the unit C comprising a cyclic terminal urea group is 10 to 50 mol % based on the copolymer, preferably 20 to 45 mol %.

The weight-average molecular weight of the copolymer is preferably 500 to 1,000,000, especially preferred 2,000 to 250,000.

The copolymer can be prepared from monomers comprising the monomers A', B' and a monomer comprising a cyclic terminal urea group, where A' and B' are defined below:

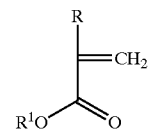

A'

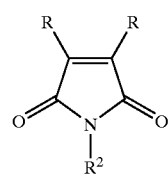

B' by known polymerization processes, such as solution polymerization, bulk polymerization, emulsion and suspension polymerization. Preferably, a solution containing monomers A', B' and the monomer comprising a cyclic terminal urea group is heated and a common initiator is added. It is also possible to add the initiator to the monomer mixture, then add an organic solvent and subsequently heat the resulting solution. $R^1$, $R^2$, and R are as defined for A and B.

An especially preferred monomer A' is methacrylic acid. Especially preferred monomers B' are N-phenylmaleimide and N-cyclohexylmaleimide. Especially preferred units comprising a cyclic terminal urea group are units C' defined below:

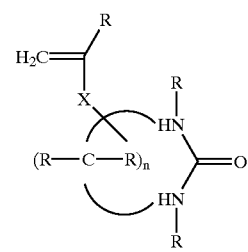

C'

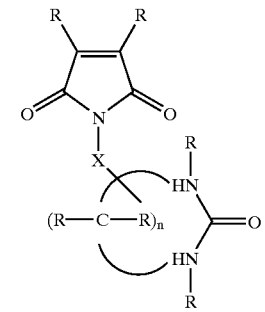

-continued

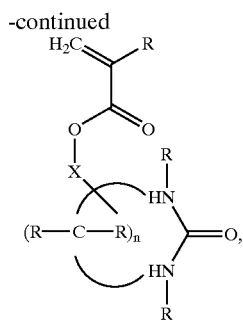

wherein R, X, and n are defined in the same way as for unit C.

In one preferred embodiment, the monomers from which the copolymer is prepared by the above procedure further comprise unit D', where D' is defined below:

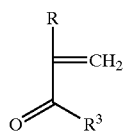

$R^3$ and R are as defined for D. Especially preferred monomers D' are methacrylamide and N-methoxymethyl methacrylate.

The copolymer can be used both as a "stand-alone" binder and as an additive, i.e. in addition to one or several further binder in the radiation-sensitive compositions of the present invention.

The preparation of the copolymer is inexpensive and it can synthetically easily be adapted to the individual compositions, i.e. independently of whether it is used as a "stand-alone" binder or as an additive, it can be adapted accordingly.

The printing forms of the present invention which are produced with such radiation-sensitive compositions are characterized by their high degree of chemical resistance, i.e. resistance to printing room chemicals and developers, and by their bakeability.

In order to take full advantage of the favorable properties of the radiation-sensitive compositions it is reasonable to adapt the copolymers to their intended use, i.e. whether they are used as an additive or as a stand-alone binder. This adaptation can easily be effected for example by modifying the monomer A content, which above all influences the alkali-solubility. If the intended use is as a resistance-increasing additive in a common positive working formulation, a higher content of unit A in the copolymer is recommended, preferably 20 to 40 mol %, than for a use as stand-alone binder for UV ink printing plates, which is preferably 5 to 20 mol %.

The basic working principle of a positive working system such as for example a printing plate involves the different rates at which exposed and unexposed image areas dissolve in the developer. Ideally, the exposed areas should dissolve as quickly as possible and the unexposed areas should not dissolve at all. The dissolution rate of the exposed elements determines the photosensitivity of a printing plate; the dissolution rate of the unexposed plate is the developer resistance. In practical applications, usually 1 to 4 minutes elapse between the point when the exposed areas are completely developed and the point when the unexposed areas are dissolved by the developer. This time period is also referred to as developer margin. In the case of especially aggressive developers, this margin can be considerably reduced so that it is often only slightly longer than the actual developing time, for example, between 15 and 30 seconds.

In the radiation-sensitive compositions of the present invention, the copolymers in combination with novolaks and naphthoquinone diazide derivatives are able to markedly increase the developer margin without reducing the photosensitivity at the same time. The maximum developer resistance occurs in the middle of a series of novolak/copolymer mixtures. In contrast, the photosensitivity of the mixture series does not show a minimum, which would be expected, since formulations having a high developer resistance are generally less photosensitive.

This phenomenon of a maximum in the developer resistance curve does not occur in a mixture of novolak/copolymer lacking the NQD, where a linear curve is obtained. All three components, i.e. novolak, copolymer and NQD, are required to give a synergistic insolubilization effect. This effect is referred to as "cross-insolubilization" herein.

If one starts from a composition comprising only the copolymer and NQD and keeps adding increasing amounts of novolak, the developer resistance increases. This is of particular interest for printing plates which are employed in UV ink printing; compositions suitable therefor require the highest possible chemical resistance and a favorable developer margin.

In the case where it is merely intended to improve the chemical resistance of radiation-sensitive compositions based on novolak and NQD by means of the copolymer additive, it is preferred to increase the amount of unit A in the copolymer. If a polymer with a low unit A content is used, the plate's photosensitivity is affected. Although the binder as a stand-alone binder together with an NQD shows hardly any developer resistance in a composition, the "cross-insolubilization" effect makes it possible that at a content of up to 50% copolymer based on the total amount of copolymer and novolak, good developer resistance is obtained without a significant decrease in photosensitivity if the unit A content is increased, for example, to 20% or more. In the case of common commercial additives which contain a high amount of alkali-soluble groups for increasing the chemical resistance, such as cellulose acetate hydrogenphthalate, a rapidly falling curve of developer resistance results. However, due to the "cross-insolubilization" effect, the copolymers are able to keep both photosensitivity and developer resistance constant over a wide range; it is not until very high copolymer contents are reached that the system undergoes "overturning" (breakdown of the cross-insolubilization effect). The instant copolymers provide a significantly increased formulation margin compared to common resistance-increasing additives.

The resistance to aggressive chemicals is significantly increased, in some cases 100-fold. In the photosensitive compositions it is irrelevant for the resistance to printing room chemicals whether the polymeric binder comprises a high or low content of unit A.

The copolymers make it possible to drastically increase the chemical resistance to printing room chemicals of a positive working system, such as a printing plate, without affecting photosensitivity and developer resistance.

These copolymers can also be employed as a main binder component in a positive working printing plate of the highest chemical resistance for UV-curing inks. The ability of the copolymers to induce a "cross-insolubilization" effect together with novolak and NQD is the key to this extremely flexible applicability.

Any polycondensation product obtained from formaldehyde and phenols by acid or neutral catalysis known to a person of ordinary skill in the art can be used as a novolak in the invention.

Any naphthoquinone diazide derivative known to a person of ordinary skill in the art can be used. Examples include the esters formed from the reaction of naphthoquinone-1,2-diazido-5-sulfonic acid chloride or naphthoquinone-1,2-diazido-4-sulfonic acid chloride and 2,4-dihydroxybenzophenone or 2,3,4-trihydroxybenzophenone.

In the present invention, it is not necessary to use novolaks and naphthoquinone diazide derivatives as separate components. Naphthoquinone diazide derivatives reacted with novolaks can also be employed. Such derivatives are referred to herein as "two-in-one" systems.

The weight ratio of novolak to copolymer in the inventive composition is preferably in the range of 90:10 to 10:90. At a ratio of novolak/copolymer of almost 100/0 to about 60/40 (% by weight), the copolymer can still be called an additive. A positive working printing plate comprising the copolymer according to the present invention shows a significantly improved chemical resistance compared to a printing plate whose photosensitive composition does not comprise the copolymer. If compositions with a novolak/copolymer ratio of about 40/60 to almost 0/100% by weight are used for the production of positive working printing plates according to the present invention, printing plates of the highest chemical resistance are obtained which are perfectly suitable for printing processes using UV-curing inks. The amount of NQD is kept constant in a range of about 20 to about 25% by weight, preferably 21% by weight, over the whole range of novolac/copolymer weight ratios.

In addition to the essential components—the copolymer, novolak and NQD—the radiation-sensitive compositions of the present invention can furthermore comprise one or more additional components selected from radiation-sensitive acid donors, dyes or pigments for increasing the contrast of the image, exposure indicators, plasticizers and mixtures thereof.

The exposure indicators suitable for use in the radiation-sensitive compositions are known to the person skilled in the art. Exposure indicators selected from triarylmethane dyes, such as Victoria Pure Blue BO, Victoria Blue R, and crystal violet, or azo dyes, such as 4-phenylazodiphenylamine, azobenzene or 4-N,N-dimethylaminoazobenzene, are preferred. The exposure indicators may be present in the composition in an amount from 0.02 to 10% by weight, especially preferred in an amount from 0.5 to 6% by weight.

Suitable dyes for increasing the contrast of the image include those which dissolve well in the solvent or solvent mixture used for the coating or which can be introduced as a pigment in particulate form. Suitable contrast dyes include, for example, rhodamine dyes, methyl violet, anthraquinone pigments and phthalocyanin dyes or pigments.

Suitable plasticizers include dibutylphthalate, triarylphosphate and dioctylphthalate. Dioctylphthalate is especially preferred. The plasticizer is preferably used in an amount of 0.25 to 2% by weight.

Based on the total weight, the radiation-sensitive composition preferably comprises 2 to 90% by weight of the copolymer, more preferably 7 to 80% by weight and most preferably 10 to 70% by weight.

The photosensitive compositions can be used in the production of printing forms (in. particular offset printing plates), printed circuit boards for integrated circuits and photomasks.

The carrier used for the printing plate of the present invention is preferably a material in the form of a sheet or a film, having a good dimensional stability. The sheet or film material is preferably a material that has already been used as a carrier for printed matter. Examples of such carriers include paper, paper coated with plastic materials, such as polyethylene, polypropylene, polystyrene, metal sheets or foils, such as aluminum, including aluminum alloys, zinc and copper sheets, plastic films made from cellulose diacetate, cellulose triacetate, cellulose propionate, cellulose acetate, cellulose acetate butyrate, cellulose nitrate, polyethyleneterephthalate, polyethylene, polystyrene, polypropylene, polycarbonate and polyvinylacetate, and a laminate comprising paper or a plastic film and one of the above-mentioned metals, or a film made from paper, plastic, or a combination of paper and plastic, which has been metallized by chemical vapor deposition. Among these carriers, an aluminum sheet or foil is especially preferred since it has a remarkable dimensional stability, is inexpensive and furthermore shows an excellent adhesion of the radiation-sensitive layer. Furthermore, a composite film can be used wherein an aluminum foil has been laminated onto a polyethyleneterephthalate film.

A metal carrier, in particular an aluminum carrier, is preferably subjected to a surface treatment, for example graining by brushing in a dry state, brushing with abrasive suspensions or electrochemically, for example in a hydrochloric acid electrolyte, and optionally further subjected to anodic oxidation.

The surface of the grained metal carrier which has optionally been anodically oxidized in sulfuric or phosphoric acid may be further subjected to an aftertreatment in an aqueous solution of sodium silicate, calcium zirconium fluoride, polyvinyl phosphonic acid or phosphonic acid. The purpose of the aftertreatment is to improve the hydrophilic properties of the surface.

The dried plates are coated with the radiation-sensitive layers of organic solvents or solvent mixtures to obtain dry layer weights preferably in the range of 0.5 to 4 $g/m^2$, most preferably 0.8 to 3 $g/m^2$.

In some cases it may be advantageous to additionally apply an oxygen- and/or moisture-blocking overcoat on the radiation-sensitive layer.

The printing plates of the present invention are exposed and developed by means of common processes known to the person skilled in the art. The developed plates are usually treated with a preservative ("rubber coating"). The preservatives are aqueous solutions of hydrophilic copolymers, wetting agents and other known additives.

The invention will be described in more detail with reference to the examples below which, however, should not be understood as limiting the present invention in any way.

EXAMPLES

Synthesis of Copolymers

The monomers listed in Table 1 below were used to prepare copolymers. To perform the polymerization, the monomers were provided in a flask with a stirrer and nitrogen inlet at 60° C. in methylglycol (total monomer concentration: 2.5 mol/l) and 0.1 mol % azobisisobutyronitrile was added as initiator. Reprecipitation was carried out in three times the amount of methanol. The obtained copolymers were dried for 48 hours at 50° C.

TABLE 1

Monomer content (in mol %) of different copolymers

| Copolymer No. | Methacrylic acid | N-phenyl maleimide | Methacrylamide | C' | Comment |
|---|---|---|---|---|---|
| 1 | 15 | 50 | 35 | 0 | Reference |
| 2 | 20 | 45 | 35 | 0 | Reference |
| 3 | 15 | 50 | 0 | 35 | Solid C' was used (methyl methacrylate distilled in the lab) |
| 4 | 17.5 | 47.5 | 0 | 35 | 50% solution of C' in water was used (status of deliverance) |
| 5 | 20 | 45 | 0 | 35 | 50% solution of C' in water was used (status of deliverance) |
| 6 | 25 | 40 | 0 | 35 | Solid C' was used (methyl methacrylate distilled in the lab) |

Monomer C' was obtained from Röhm (Plex 6852-O) in two versions: one is a 25% solution in methyl methacrylate, which was distilled off before use. The other is a 50% solution in water, which was used directly. All monomers are dissolved in dioxolane/ethanol to give a one molar solution of the monomer. AIBN was used as an initiator at 0.1 mole-%. Polymerizations were performed at 60° C. under nitrogen for about 20 hours. Reprecipitation was performed in ethanol/water (80:20). The copolymer product was dried at 50° C. for 3–4 days. The product was obtained as white flakes in a yield of about 75 to about 95%. Reactions were performed on a scale of about 100 grams of reactant.

Examples of Preparation of Printing Plate Precursors

Preparative Example 1

The copolymers obtained in the Synthesis of Copolymers Example were added to positive working radiation-sensitive standard compositions for printing plates. A composition comprising 15 wt-% of Trump Dye (an IR-dye having spectral sensitivity at 830 nm) and 85 wt-% of one of copolymers 1–6 from Table 1 was dissolved in a solvent consisting of 70 wt.-% tetrahydrofuran, 10 wt.-% water and 20 wt.-% methylglycol. The solution was coated on a regular aluminum substrate with a coating weight of 2 g/m$^2$. A topcoat as described in U.S. Pat. No. 6,294,311 and comprising 30.11 wt.-% of P-3000 (available from PCAS), an ester of a pyrogallole-acetone novolak (MW=3000) with 2,1-naphthoquinone diazide-5-sulfonic acid, 63.25 wt.-% of PD-140 (available from Borden), a cresole/formaldehyde novolac (meta/para=60/40, MW=6000), 6.03 wt.-% of HRJ-302 (available from Schenectady), a novolac where a majority of phenolic OH groups are esterified with octylgroups, 0.23 wt.-% of Ethylviolet, and 0.38 wt.-% of BYK-307 (available from BYK-Chemie), a surfactant containing ethoxylated polysiloxane units, dissolved in a 90:10 methyl ethyl ketone/DOWANOL® PM solution, was applied upon the coating. The film weight of the topcoat was 0.75 gm$^{-2}$.

The resulting plate precursors were tested for exposure, bakeability, and chemical resistance. The test results are shown in Table 2 which compares copolymers 3–6 with reference copolymer 2. Exposure was performed with a Creo Trendsetter at 10 Watt with different drum speeds. Plates were developed with Kodak Polychrome Graphics developer 956 for a dwelltime of 15, 30 and 45 seconds. Bakeability was tested by baking for 8 minutes at 235° C. and treating with Kodak Polychrome Graphics deletion fluid type 243 (2–10 minutes) and with an abrasion test to determine the coating loss of the baked plates. Chemical resistance was tested with a laboratory test wash for UV inks, consisting of either 80% DAA and 20% water, or 80% butyl glycol and 20% water.

TABLE 2

Results of exposure, bakeability, and chemical resistance tests for the compositions of Preparative Example 1

| Property | Copolymer 2 | Copolymer 3 | Copolymer 4 | Copolymer 5 | Copolymer 6 |
|---|---|---|---|---|---|
| Optimum exposure (mJ/cm$^2$) | 100 | 100 | 150 | 200 | >200 |
| Chemical resistance (diacetone alcohol (DAA)/Water 80:20) | 2 | >2 | >2 | >2 | >2 |
| Chemical resistance (butyl glycol/water 80:20) | >2 | >>2 | >>2 | >>2 | >>2 |
| Mechanical resistance (unbaked) (g/m$^2$) | 1.2 | 1.2 | 1.3 | 1.4 | 1.3 |
| Mechanical resistance (baked) (g/m$^2$) | 1.4 | 1.14 | 1.09 | 1.07 | — |
| Deletion fluid test (baked) (min) | <1 | >>10 | >>10 | >>10 | >>10 |

The values for the chemical resistance shown in Table 2 represent the time in minutes required for the loss of coating weight to exceed 30%. The data for the mechanical resistance represent the coating weight loss values obtained by a plynometer. Here, the plate is rubbed with a grinding liquid for 15 minutes. Different types of grinding liquids were used for unbaked and baked plates. The values for the deletion fluid test are obtained by visible estimation of the time in minutes required for the first coating attack to appear.

The results of Table 2 show that the copolymers comprising monomer D' are fully bakeable. Chemical and mechanical resistance is improved strongly. Further improvement in mechanical resistance is expected to occur when the monomers from which the copolymer is prepared include acrylonitrile.

Preparative Example 2

The copolymers of Table 1 were also tested in a UV-ink resistant positive system. A composition comprising 21.0 wt-% of the ester of dihydroxybenzophenone with 2,1-naphthoquinone diazide-5-sulfonic acid, 15.3 wt-% of PD-140 (available from Borden), a cresole/formaldehyde novolac (meta/para=60/40, MW=6000), 61.3 wt-% of a copolymer from table 1, 1.4 wt-% of Ethylviolet, and 1 wt-% of Triazine B was dissolved in a solvent consisting of 70 wt.-% dioxolane, 10 wt.-% water, 10 wt.-% methylglycol, and 10 wt.-% methyllactate. The solution was coated on a regular aluminum substrate with a coating weight of 2 g/m$^2$. Bakeability and chemical resistance were tested as described above for the compositions of Preparative Example 1. Exposure was performed in a standard exposure frame at 360mJ/cm$^2$ and developed with KPG positive developer type 4009. The test results are shown in Table 3 which compares copolymers 3 and 4 with reference copolymer 1.

TABLE 3

Results of exposure, bakeability, and chemical resistance tests for the compositions of Preparative Example 2

| Property | Copolymer 1 (reference) | Co-polymer 3 | Copolymer 4 |
|---|---|---|---|
| Exposure speed 4009 (free step UGRA-scale) | 2.66 | 2.33 | 2 |
| Resistance to developer 4009 (minutes required for coating attack to exceed 30 wt-%) | 2 | 2–3 | 3 |
| Chemical resistance (DAA/water) | 2 | >2 | >2 |
| Chemical resistance (butyl glycol/water) | >2 | >2 | >2 |
| Mechanical resistance (unbaked) (g/m$^2$) | 1.26 | 1.16 | 1.21 |
| Mechanical resistance (baked) (g/m$^2$) | 1.04 | 0.83 | 0.76 |
| Deletion fluid test (baked) (min) | 2 | >>10 | >>10 |

The baked plates comprising copolymers 3 and 4 achieve a better mechanical and chemical resistance compared to copolymer 1, which is not bakeable.

It should be understood that various changes and modifications to the preferred embodiments described herein will be apparent to those skilled in the art. Such changes and modifications can be made without departing from the spirit and scope of this invention and without diminishing its attendant advantages. It is therefore intended that such changes and modifications be covered by the appended claims.

I claim:

1. A copolymer for use in coating compositions for printing plate precursors, the copolymer comprising units A, B, and a unit C comprising a cyclic terminal urea group, wherein unit A is present in an amount of about 5 to about 50 mol % and has the formula

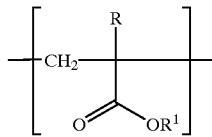

A wherein $R^1$ is selected such that the homopolymer of A is alkali-soluble, unit B is present in an amount of about 20 to about 70 mol % and has the following formula

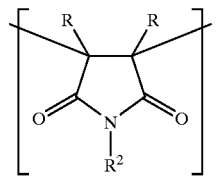

B wherein $R^2$ is selected such that the homopolymer of B has a glass transition temperature greater than 100° C., preferably a glass transition temperature in the range from about 100 to about 380° C., and the unit C comprising a cyclic terminal urea group is present in an amount of about 10 to about 50 mol % and has the formula

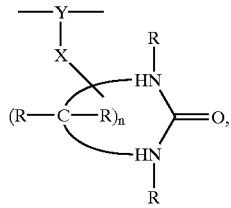

C wherein X is a spacer group which is preferably selected from the group consisting of (a) a —(CR$_2$)$_m$— chain, (b) a —[CH$_2$—CH$_2$—O]$_m$— chain; and (c) a —[Si(R$_2$)—O]$_m$— unit, m is an integer between 2 and 12, the spacer group is connected to one of the carbon ring atoms of the cyclic urea unit or to one of the nitrogen atoms of the cyclic urea unit, and n is an integer between 1 and 5; and Y is a group selected from the group consisting of:

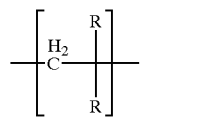 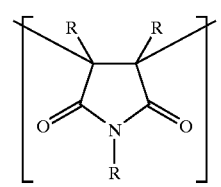

and

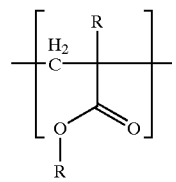

wherein each R in units A, B, and C, the —(CR$_2$)$_m$— chain, the —[Si(R$_2$)—O]$_m$— unit, and group Y is independently selected from hydrogen, aryl, (C$_1$–C$_{12}$) alkyl, and halogen.

2. A copolymer according to claim 1, wherein $R^1$ in unit A of the copolymer is selected from the group consisting of hydrogen, aryl and (C$_1$–C$_{12}$)alkyl having at least one carboxy group.

3. A copolymer according to claim 1, wherein the copolymer has a weight-average molecular weight in the range of 500 to 1,000,000.

4. A copolymer according to claim 1, wherein the copolymer further comprises unit D, wherein unit D is present in an amount of about 10 to about 50 mol % and has the formula

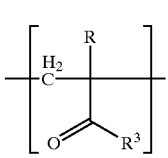

D wherein $R^3$ is selected such that the homopolymer of D is miscible with water in any ratio, and R is independently selected from hydrogen, aryl, (C$_{1-C12}$)alkyl, and halogen, with the proviso that unit D is different from unit A.

5. A copolymer according to claim 4, wherein $R^3$ in unit D of the copolymer is selected from the group consisting of hydrogen, a $(C_1-C_{12})$ alkyl group, a $(C_3-C_8)$ cycloalkyl group, an aryl group, an $-NH(CH_2)_nO$-alkyl group, an $-NHR^4$ group, and a $(C_1-C_{12})$alkoxy group, wherein n is an integer between 1 and 20 and wherein $R^4$ is hydrogen, $(C_1-C_{12})$ alkyl or aryl.

6. A copolymer according to claim 5, wherein the $C_1-C_{12}$ alkyl group comprises at least one hydroxy group and at least one substituent selected from the group consisting of halogen and $-NO_2$.

7. A copolymer according to claim 5, wherein the $C_3-C_8$ alkyl group comprises at least one hydroxy group and at least one substituent selected from the group consisting of halogen and $-NO_2$.

8. A copolymer according to claim 5, wherein the aryl group comprises at least one hydroxy group and at least one substituent selected from the group consisting of halogen, $(C_1-C_{12})$alkyl and $-NO_2$.

9. A radiation-sensitive composition comprising
(a) at least one novolak;
(b) at least one naphthoquinone diazide derivative; and
(c) a copolymer comprising units A, B, and a unit C comprising a cyclic terminal urea group, wherein unit A is present in an amount of about 5 to about 50 mol % and has the formula

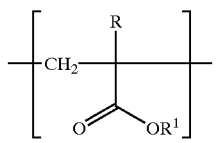

A wherein $R^1$ is selected such that the homopolymer of A is alkali-soluble, unit B is present in an amount of about 20 to about 70 mol % and has the following formula

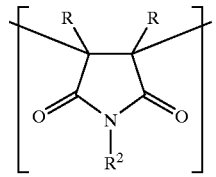

B wherein $R^2$ is selected such that the homopolymer of B has a glass transition temperature greater than 100° C., preferably a glass transition temperature in the range from about 100 to about 380° C., and the unit C comprising a cyclic terminal urea group is present in an amount of about 10 to about 50 mol % and has the formula

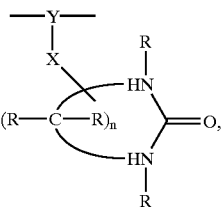

C wherein X is a spacer group which is preferably selected from the group consisting of (a) a $-(CR_2)_m-$ chain, (b) a $-[CH_2-CH_2-O]_m-$ chain; and (c) a $-[Si(R_2)-O]_m-$ unit, wherein m is an integer between 2 and 12, the spacer group is connected to one of the carbon ring atoms of the cyclic urea unit or to one of the nitrogen atoms of the cyclic urea unit, and n is an integer between 1 and 5; and Y is a group selected from the group consisting of:

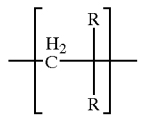 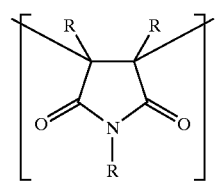

and

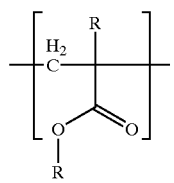

wherein each R in units A, B, and C, the $-(CR_2)_m-$ chain, the $-[Si(R_2)-O]_m-$unit, and group Y is independently selected from hydrogen, aryl, $(C-C_{12})$ alkyl, and halogen.

10. A radiation-sensitive composition according to claim 9, wherein the weight ratio of novolak to copolymer is in the range of 90:10 to 10:90.

11. A radiation-sensitive composition according to claim 9, wherein the copolymer is present in an amount of at least 60% by weight based on the total amount of copolymer and novolak.

12. A radiation-sensitive composition according to claim 9, wherein the copolymer acts as a binder and the composition does not comprise an additional binder.

13. A radiation-sensitive composition according to claim 9, wherein the composition additionally comprises at least one further component selected from radiation-sensitive acid donors, dyes or pigments for increasing the contrast of the image, exposure indicators and plasticizers.

14. A radiation-sensitive composition according to claim 9, wherein $R_1$ in unit A of the copolymer is selected from the group consisting of hydrogen, aryl and $(C_1-C_{12})$ alkyl having at least one carboxy group.

15. A radiation-sensitive composition according to claim 9, wherein $R^2$ in unit B of the copolymer is selected from the group consisting of hydrogen, aryl, $(C_1-C_{12})$ alkyl, $(C_3-C_8)$ ycloalkyl.

16. A radiation-sensitive composition according to claim 9, wherein the copolymer has a weight-average molecular weight in the range of 500 to 1,000,000.

17. A radiation-sensitive composition according to claim 9, wherein the novolak and the naphthoquinone diazide derivative are not used as separate components but in the form of a naphthoquinone diazide derivative reacted with a novolak.

18. A radiation-sensitive composition according to claim 9, wherein the copolymer further comprises unit D, wherein unit D is present in an amount of about 10 to about 50 mol % and has the formula

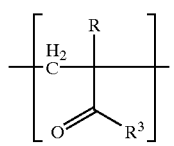

D wherein $R^3$ is selected such that the homopolymer of D is water-soluble and R is independently selected from hydrogen, aryl, $(C_1-C_{12})$ alkyl, and halogen, with the proviso that unit D is different from unit A.

19. A radiation-sensitive composition according to claim 18, wherein $R^3$ in unit D of the copolymer is selected from the group consisting of hydrogen, a $(C_1-C_{12})$alkyl group, a $(C_3-C_8)$cycloalkyl group, an aryl group, an —NH(CH$_2$)$_n$O—alkyl group, an —NHR$^4$ group, and a $(C_1-C_{12})$alkoxy group, wherein n is an integer between 1 and 20 and wherein $R^4$ is hydrogen, $C_1-C_{12}$ alkyl or aryl.

20. A radiation-sensitive composition according to claim 19, wherein the $C_1-C_{12}$ alkyl group comprises at least one hydroxy group and at least one substituent selected from the group consisting of halogen and —NO$_2$.

21. A radiation-sensitive composition according to claim 19, wherein the $C_3-C_8$ alkyl group comprises at least one hydroxy group and at least one substituent selected from the group consisting of halogen and —NO$_2$.

22. A radiation-sensitive composition according to claim 19, wherein the aryl group comprises at least one hydroxy group and at least one substituent selected from the group consisting of halogen, $(C_1-C_{12})$alkyl and —NO$_2$.

23. A printing plate comprising
(a) a substrate; and
(b) a radiation-sensitive layer, wherein the radiation sensitive layer comprises a copolymer comprising units A, B, and a unit C comprising a cyclic terminal urea group, wherein unit A is present in an amount of about 5 to about 50 mol % and has the formula

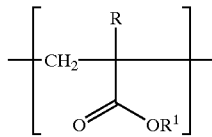

A wherein $R^1$ is selected such that the homopolymer of A is alkali-soluble, unit B is present in an amount of about 20 to about 70 mol % and has the following formula

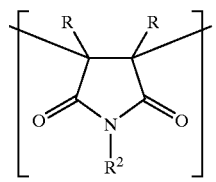

B wherein $R^2$ is selected such that the homopolymer of B has a glass transition temperature greater than 100° C., preferably a glass transition temperature in the range from about 100 to about 380° C., and the unit C comprising a cyclic terminal urea group is present in an amount of about 10 to about 50 mol % and has the formula

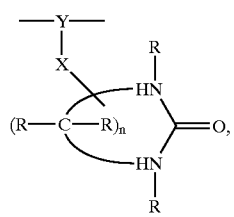

C wherein X is a spacer group which is preferably selected from the group consisting of (a) a —(CR$_2$)$_m$— chain, (b) a —[CH$_2$—CH$_2$—O]$_m$— chain; and (c) a —[Si(R$_2$)—O]$_m$— unit, wherein m is an integer between 2 and 12, the spacer group is connected to one of the carbon ring atoms of the cyclic urea unit or to one of the nitrogen atoms of the cyclic urea unit, and n is an integer between 1 and 5; and Y is a group selected from the group consisting of:

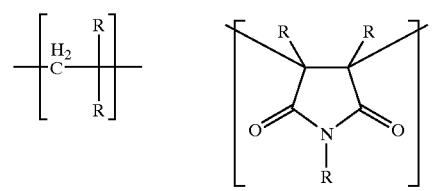

and

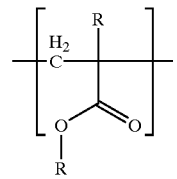

wherein each R in units A, B, and C, the —(CR$_2$)$_m$— chain, the —[Si(R$_2$)—O]$_m$— unit, and group Y is independently selected from hydrogen, aryl, $(C_1-C_{12})$ alkyl, and halogen.

24. A printing plate according to claim 23, wherein the copolymer further comprises unit D, wherein unit D is present in an amount of about 10 to about 50 mol % and has the formula

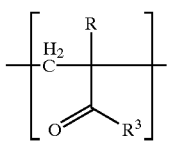

D wherein $R^3$ is selected such that the homopolymer of D is water-soluble and R is independently selected from hydrogen, aryl, $(C_1-C_{12})$ alkyl, and halogen, with the proviso that unit D is different from unit A.

25. A printing plate according to claim 23 wherein the substrate is an aluminum substrate laminated onto a polyethyleneterephthalate film.

26. A method for producing a printing plate comprising:
(a) providing a substrate;
(b) preparing a solution of a radiation-sensitive composition in an organic solvent, wherein the radiation-sensitive composition comprises
(i) at least one novolak;
(ii) at least one naphthoquinone diazide derivative; and
(iii) a copolymer comprising units A, B, and a unit C comprising a cyclic terminal urea group, wherein unit A is present in an amount of about 5 to about 50 mol % and has the formula

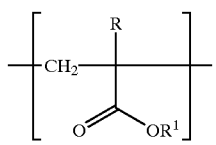
A wherein $R^1$ is selected such that the homopolymer of A is alkali-soluble, unit B is present in an amount of about 20 to about 70 mol % and has the following formula

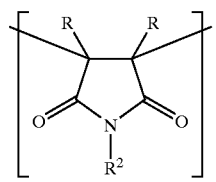
B wherein $R^2$ is selected such that the homopolymer of B has a glass transition temperature greater than 100° C., preferably a glass transition temperature in the range from about 100 to about 380° C., and the unit C comprising a cyclic terminal urea group is present in an amount of about 10 to about 50 mol % and has the formula

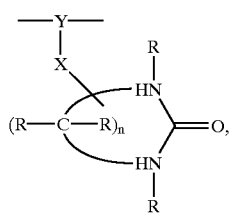
C wherein X is a spacer group which is preferably selected from the group consisting of (a) a $-CR_2)_m-$ chain, (b) a $-[CH_2-CH_2-O]_m-$ chain; and (c) a $-[Si(R_2)-O]_m-$ unit, wherein m is an integer between 2 and 12, the spacer group is connected to one of the carbon ring atoms of the cyclic urea unit or to one of the nitrogen atoms of the cyclic urea unit, and n is an integer between 1 and 5; and Y is a group selected from the group consisting of

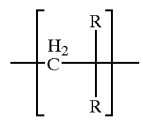 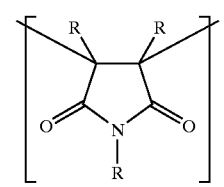

and

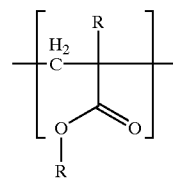

wherein each R in units A, B, and C, the $-(CR_2)_m-$ chain, the $-[Si(R_2)-O]_m-$ unit, and group Y is independently selected from hydrogen, aryl, ($C_1-C_{12}$) alkyl, and halogen;

(c) applying the solution prepared in step (b) to the substrate; and
(d) drying the solution.

27. A method according to claim 26, wherein the copolymer further comprises unit D, wherein unit D is present in an amount of about 10 to about 50 mol % and has the formula

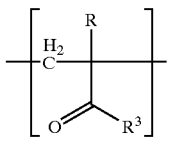
D wherein $R^3$ is selected such that the homopolymer of D is water-soluble and R is independently selected from hydrogen, aryl, ($C_1-C_{12}$) alkyl, and halogen, with the proviso that unit D is different from unit A.

* * * * *

UNITED STATES PATENT AND TRADEMARK OFFICE
CERTIFICATE OF CORRECTION

PATENT NO. : 6,645,689 B2
DATED : November 11, 2003
INVENTOR(S) : Mathias Jarek

It is certified that error appears in the above-identified patent and that said Letters Patent is hereby corrected as shown below:

Column 16,
Line 55, delete "ycloalkyl" and insert therefor -- cycloalkyl --

Signed and Sealed this

Thirteenth Day of April, 2004

JON W. DUDAS
*Acting Director of the United States Patent and Trademark Office*